United States Patent
Ausserlechner

(10) Patent No.: US 7,110,232 B2
(45) Date of Patent: Sep. 19, 2006

(54) SEMICONDUCTOR CIRCUIT WITH PROTECTIVE CIRCUIT

(75) Inventor: Udo Ausserlechner, Villach (AT)

(73) Assignee: Infineon Technologies AG, Munich (DE)

( * ) Notice: Subject to any disclaimer, the term of this patent is extended or adjusted under 35 U.S.C. 154(b) by 238 days.

(21) Appl. No.: 10/813,729

(22) Filed: Mar. 31, 2004

(65) Prior Publication Data

US 2004/0207965 A1  Oct. 21, 2004

(30) Foreign Application Priority Data

Mar. 31, 2003  (DE) ................ 103 14 601

(51) Int. Cl.
*H02H 3/20* (2006.01)
*H02H 3/24* (2006.01)

(52) U.S. Cl. ....................................... 361/90
(58) Field of Classification Search ................ 361/90
See application file for complete search history.

(56) References Cited

U.S. PATENT DOCUMENTS 5,182,470 A * 1/1993 Gariboldi et al. ........... 327/545
5,270,565 A * 12/1993 Lee et al. .................... 257/358
5,608,259 A * 3/1997 DeShazo et al. ............. 257/547
5,648,739 A * 7/1997 Walther et al. .............. 327/330

FOREIGN PATENT DOCUMENTS

DE    197 17 527 A1   10/1998
DE    197 33 707 A1   2/1999

* cited by examiner

*Primary Examiner*—Brian Sircus
*Assistant Examiner*—Ann T. Hoang
(74) *Attorney, Agent, or Firm*—Baker Botts L.L.P.

(57) ABSTRACT

A semiconductor circuit in a semiconductor substrate includes a first input for feeding a first supply potential, a second input for feeding a second supply potential higher than the first supply potential, a device, an output and a parasitic pn-junction between the device and the semiconductor substrate, which is conductive at a first polarizing potential at the output smaller than the first supply potential or at a second polarizing potential at the output greater than the second supply potential. A protective circuit whose electric resistance at the first polarizing potential at the output and at the second polarizing potential at the output, respectively, is higher than at a normal operation potential at the output lying between the first supply potential and the second supply potential is connected between the output and the parasitic pn-junction.

20 Claims, 9 Drawing Sheets

Prior Art

US 7,110,232 B2

SEMICONDUCTOR CIRCUIT WITH PROTECTIVE CIRCUIT

PRIORITY

This application claims priority to German application no. 103 14 601.6 filed Mar. 31, 2003.

TECHNICAL FIELD OF THE INVENTION

The present invention relates to a semiconductor circuit in a semiconductor substrate with a protective circuit for the protection against destruction of the semiconductor circuit by polarizing an output of the semiconductor circuit in production or operation thereof.

DESCRIPTION OF THE RELATED ART

Electronic assemblies are usually powered by at least two supply voltage terminals and provide an output signal to at least one output. In the following, the lowest supply potential or the lowest potential present on one of the supply voltage terminals is designated a reference potential or ground, and the supply voltage terminal via which its reference potential is fed to the electronic assembly is designated GND (ground). Similarly, in the following the supply voltage terminal on which the highest supply potential is present is designated with VDD and the output with OUT. The electric potentials present at the supply voltage terminals GND and VDD as well as the output Out are designated with $V_{GND}$, $V_{VDD}$ and $V_{OUT}$, respectively.

In the normal operation, i.e. in operational states for which the assembly is provided, the output potential $V_{OUT}$ lies between the supply potentials $V_{GND}$, $V_{VDD}$, $V_{GND} \leq V_{OUT} \leq V_{VDD}$. This relation also applies if the output OUT of the electronic assembly is not a voltage output but a current output. In this case, the output OUT supplies an output current $I_{OUT}$ flowing through a load connected to the output OUT and thus creating a potential $V_{OUT}$ for which the above relation again applies. Exceptional cases exist in which for example the output OUT is connected to an external potential $V_p$ via a pull-up load resistor, and wherein $V_p > V_{VDD}$ may be. In this case $V_{OUT} > V_{VDD}$ is possible depending on task, function and operational state of the electronic assembly.

In electronic assemblies for which the above-described potential ratios $V_{GND} \leq V_{OUT} \leq V_{VDD}$ are provided and adapted it may happen (by mistake) that $V_{OUT} < V_{GND}$ or $V_{OUT} > V_{VDD}$. In the build-in of the electronic assembly in an electronic system, it may for example come to a short or more generally to a non-provided electrically conductive connection between contacts by mistake or mistakenly, whereby the potential becomes $V_{OUT} < V_{GND}$ or $V_{OUT} > V_{VDD}$. During operation of the electronic assembly it may happen that due to an interlay not foreseen or not taken into account in the dimensioning of the electronic assembly of the electronic assembly with one or more other electronic assemblies an overvoltage $V_{OUT} > V_{VDD}$ or an undervoltage $V_{OUT} < V_{GND}$ results at the output OUT. An inductive load may for example cause such an over or undervoltage at the output OUT at least transiently. Moreover, badly insulated cables, cable- or line-break, faulty solder joints, cable lugs coming off, and similar events may cause an over or undervoltage at the output OUT.

For electronic assemblies it is often demanded that they are not damaged or destroyed if a potential V out is impressed on the output OUT, which is $V_{OUT} > V_{VDD}$ or $V_{OUT} < V_{GND}$. If the electronic devices or components of the electronic assembly that are connected to the output OUT are discrete devices or components, for example discrete power transistors, then this requirement is usually easily met or over or undervoltages present an insignificant stress case.

The conditions are, however, completely different if the devices of the electronic assembly that are connected to the output OUT are arranged or formed in a common conductive substrate, as this is for example the case in the vast majority of integrated circuits (ICs). In integrated circuits in semiconductor substrates, individual devices are regularly electrically insulated by reversely biased or non-conductive pn-junctions from the substrate. These pn-junctions are arranged so that in the normal operation ($V_{GND} \leq V_{OUT} \leq V_{VDD}$) the p-doped parts of the pn-junctions to substrate each lie on a lower potential than the n-doped parts. By an undervoltage event ($V_{OUT} < V_{GND}$) or an overvoltage event ($V_{OUT} > V_{DDD}$), as it has been described above, voltages in pass-through direction may be generated at the pn-junctions. Thereby undesired law-ohmic connections of individual devices to the substrate or via the substrate to each other arise. Such a short usually results in a destruction of the integrated circuit.

On the basis of FIGS. 7 and 8, the effect of such an undervoltage event $V_{OUT} < V_{GND}$ is described in the following. FIG. 7 shows a schematic circuit diagram of an integrated circuit with an operational amplifier OP. The operational amplifier OP includes an output stage including a pnp-transistor PNP and an npn-transistor NPN. The output of the operational amplifier OP controls an output or output voltage terminal OUT of the integrated circuit. Emitter, basis and collector of the pnp-transistor PNP are designated with ep, bp and cp, respectively, emitter, basis and collector of the npn-transistor NPN are designated with en, bn and cn, respectively.

The details of the circuit of the non-inverting input (+) and the inverting input (−) of the operational amplifier OP are largely omitted in this schematic illustration, wherein only a feedback of the output of the operational amplifier OP via a resistor Ra to the inverting input (−) is illustrated.

The emitter ep of the pnp-transistor PNP is connected to the supply voltage terminal VDD, and the emitter en of the npn-transistor NPN is connected to the supply voltage terminal GND. The integrated circuit is formed in a p-substrate. A voltage splitter from two resistors Ra and Rb connected in series is connected between the output of the operational amplifier OP of the output OUT of the integrated circuit on the one hand and the p-substrate on the other. For the feedback of the operational amplifier OP, the center tap of this voltage splitter is connected to the inverting input (−) of the operational amplifier OP between the resistors Ra and Rb.

The collectors cp, cn of the pnp-transistor PNP and the npn-transistor NPN are connected to the output OUT. Thereby, the operational amplifier OP may generate output potentials $V_{OUT}$ lying between $V_{GND}$ and $V_{VDD}$.

FIG. 8 shows the technological construction of the integrated circuit illustrated in FIG. 7 in a vertical section or a section perpendicular to the surface of the p-substrate in which the devices of the integrated circuit are formed. As already mentioned in the description of FIG. 7, in this example it is being started from a p-substrate or a p-doped substrate. In order to electrically insulate all devices of the integrated circuit above the p-substrate in a normal mode of operation, it is customary to connect a p-substrate to the lower supply potential $V_{GND}$. Thereby, the substrate lies at the lowest potential, while all devices lie in a higher potential or at least not at a lower. All pn-junctions between the p-substrate (p-doped, anode) and the devices of parts thereof (n-doped, cathode) are thus either operated in reverse direction or at least not in flow direction. Consequently, no or only a very small current flows from the various devices into the p-substrate via the pn-junctions.

It is noted that it is possible to inject a current into the p-substrate if this is desired. To this end, a vertical substrate-pnp-junction may for example be used whose collector is identical with the p-substrate. By contrast, the above-described pn-junctions between the p-substrate and devices or parts thereof are designated as parasitic pn-junctions that are to be non-conductive without exception in a normal mode of operation, as described. These parasitic pn-junctions are, as mentioned, present only because the devices are arranged in the p-substrate.

In FIG. 8 the npn-transistor NPN and the pnp-transistor PNP are illustrated next to each other in cross-section. The npn-transistor NPN includes an annular-shaped collector sub-area or n-sinker nSink that is relatively strongly n-doped, in order to be as well electrically conductive as possible. The n-sinker or nSink is also designated as n-sinker diffusion. The n-sinker nSink contacts a lowly n-doped epitaxially created n-epitaxy layer nepi. In order to decrease the influence of the relatively high electric resistance of the n-epitaxy layer nEpi, a strongly n-doped buried layer or n-buried layer is disposed in parallel to the n-epitaxy layer nEpi or therebetween and the p-substrate. Within the annular-shaped n-sinker diffusion nSink a well-shaped p-doped base area pBase is arranged that is spaced from the n-doped buried layer nBl in vertical direction and forms the base of the npn-transistor NPN. An n-doped emitter area nEmitter is spatially spaced from both the n-sinker diffusion nSink at the n-epitaxy layer nEpi or arranged in a spatially separated manner therefrom by the p-doped area pBase and forms the emitter of the npn-transistor NPN.

Highly doped areas on the surface 10 of the p-substrate within the n-sinker diffusion nSink, the base pBase and the emitter nEmitter serve for the production of ohmic contacts with one or more wiring planes arranged on the surface 10 of the p-substrate or wiring traces disposed therein, which mostly consist of aluminum. These highly doped areas form the emitter contact 12, the base contact 14, and the collector contact 16 of the npn-transistor NPN. Within the npn-transistor NPN, the current flow from the collector or the n-epitaxy layer nEpi across the base or the base area pBase to the emitter or the emitter area nEmitter is vertical or perpendicular to the surface 10 of the p-substrate.

The pnp-transistor PNP includes a small strongly p-doped emitter 22 laterally surrounded by a p-doped collector 24. The collector 24 is surrounded by an also annular-shaped n-doped base 26. Emitter 22, collector 24, and base 26 are, for example by diffusion, formed in the n-epitaxy layer nEpi spatially separated from the p-substrate by the n-doped buried layer nBl. In the pnp-transistor PNP the current flow from the emitter 22 to the base 26 is parallel to the surface of the p-substrate, the pnp-transistor PNP is therefore designated as lateral device.

A p-insulation diffusion piso contacting the p-substrate via an underlying p-doped buried layer or p-buried layer pBL is arranged laterally between the npn-transistor NPN and the pnp-transistor PNP. The p-insulation diffusions pIso also include strongly p-doped lines via which the ohmic contact to the overlying wiring plane is made.

The emitter 22, the collector 24, and the base 26 of the pnp-transistor PNP include highly-doped areas on the surface 10 of the substrate pSubstrat, which serve as emitter terminal 32, collector terminal 34, and base terminal 36 for the production of ohmic contacts with overlying wiring traces.

In FIG. 8 it is clearly recognizable that the n-sinker diffusion nSink, the n-epitaxy layer nepi and the n-doped buried layer nBL form the cathode and the p-substrate the anode of a parasitic diode. As long as the p-substrate has a lower or more negative electric potential than the n-sinker diffusion nSink, the n-epitaxy layer nEpi, and the n-doped buried layer nBL, this parasitic diode is operated in reverse direction. But as soon as an electric potential is present at the output OUT that is lower than the supply potential $V_{GND}$ by more than one diode flow voltage, a greater current flows across this parasitic diode, which results in strong heating of the integrated circuit and finally in its destruction. This diode flow voltage is 0.6 V in silicon at room temperature and decreases at higher temperatures. The diode flow voltage is for example about 0.3 V at 150° C. At this temperature it thus has to be ensured that $V_{OUT}-V_{GND}>-0.3$ V applies. For $V_{OUT}-V_{GND}<-0.3$ V, the case described above as undervoltage is present at 150° C.

For numerous circuits, such as for automotive or industrial applications, employed in rough field operation, however, great robustness is demanded, and in particular a shorting strength of integrated circuits up to $V_{OUT}-V_{GND}=-10$ V.

It is noted that when using an n-doped substrate instead of the p-substrate shown in FIGS. 7 and 8, the n-substrate is connected to the supply voltage terminal VDD. In the normal mode of operation, the n-substrate thereby lies on the highest potential present at the integrated circuit. Thereby all pn-junctions between the n-substrate and devices formed therein or parts thereof are reversely biased or non-conductive. If a pnp-transistor PNP directly lies in the n-substrate, and if the p-collector of this transistor controls the output OUT, VOUT must not increase above $V_{VDD}$, because otherwise the parasitic pn-junction between the p-collector and the n-substrate is polarized in flow direction, and the resulting strong current results in a strong heating of the integrated circuit and its destruction.

Similar conditions or the same problem occur if the npn- or pnp-bipolar transistors are replaced by n- or p-MOS transistors in the circuits exemplarily described on the basis of FIGS. 7 and 8. With respect to the above considerations, the drain of the n-MOS transistor for example replaces the collector of the npn-bipolar transistor. Exactly like the collector of the npn-bipolar transistor, the drain of the n-MOS transistor is also n-doped and forms a pn-junction with the p-substrate, that is polarized in pass-through direction or forms a short between the drain and the p-substrate, when a potential more negative relative to the substrate ($V_{GND}$) is present at the drain.

With respect to the above shorting considerations, the drain of a p-MOS transistor corresponds to the collector of a pnp-bipolar transistor. Both are p-doped and form a pn-junction with the n-substrate, which is polarized in a pass-through direction or shorted, when a potential more positive relative to the n-substrate connected to the highest supply potential $V_{VDD}$ is present at the drain or the collector. These problems exist for both standard CMOS processes and for BiCMOS processes.

A very simple conventional solution of the problem of the sensitivity of an integrated circuit to an under or overvoltage illustrated above on the basis of FIGS. 7 and 8 is described in the following on the basis of FIG. 9. The integrated circuit that is illustrated here corresponding to FIG. 8 in a vertical section differs from the one illustrated in FIGS. 7 and 8 in that a resistor R that is separated by insulating layers from other diffusion areas of the IC (e.g. a polysilicon resistor) is connected between the collectors cn, cp of the npn-transistor NPN and the pnp-transistor PNP on the one hand and the output OUT of the integrated circuit on the other. Here the parasitic pn-junctions between the collector of the npn-transistor NPN and the p-substrate are also again polarized in flow direction if the case of the undervoltage $V_{OUT} < V_{GND}$ occurs. The resistor R, however, here restricts the current flow to a measure that does not yet lead to a destruction of the integrated circuit. If the value of the resistor R is for example 50 Ω, the current flow at $V_{OUT} - V_{GND} = -5$ V at room temperature is restricted to about (5 V−0.6 V)/50 Ω=88 mA if the flow voltage or pass-through voltage of the pn-junction is 0.6 V. At the current I=88 mA, the loss power or the power consumed in the integrated circuit due to an undervoltage event is 0.44 W. If the integrated circuit or the chip in which it is formed is mounted in a small plastic housing, the thermal transition resistance between the substrate and the environment is 100° C./W in order of magnitude, so that the integrated circuit heats by about 44° C. relative to the ambient temperature.

In comparison, the current flow without the resistor R would be about 10 times as high or even higher, whereby the integrated circuit would heat by at least about 440° C. relative to the environment. This would result in an immediate thermal destruction thereof.

In general, this conventional solution thus is to insert a resistor R between the output OUT on the one hand and all diffusion areas endangered by polarizing on the integrated circuit on the other hand. The resistor R itself must not consist of any endangered diffusion area. For the realization of the resistor R, for example poly low ohm or low-ohmic polysilicon may for example be used. The low-ohmic polysilicon is insulated from the substrate and all diffusion areas lying therein by applying a thick dielectric, such as field oxide, to the substrate surface prior to the creation of the low-ohmic polysilicon. The low-ohmic polysilicon is deposited on the thick dielectric and suitably doped. The laterally structured low-ohmic polysilicon layer forms a resistance spot that, apart from contact zones at which the resistance is afterwards connected to wiring conductors in wiring planes, hermetically seals an overlying non-conductive layer.

Although the resistor R illustrated on the basis of FIG. 9 is employable for many linear outputs or outputs controlled from an amplifier, the use of the resistor R in practice has several disadvantages described in the following.

For the protection of the integrated circuit against the consequences of a connection the wrong way round or an under or overvoltage at the output OUT, the value of the resistor R is to be chosen as great as possible. On the other hand, the resistor R lies in series to an externally attached load $R_L$. A great value of the resistor R therefore creates additional flaws or limitations in the normal operation since a voltage division between the externally attached load $R_L$ and the resistor R occurs. At the external load $R_L$, the entire voltage of the operational amplifier output is no longer present, i.e. the dynamic range is shrunk.

Assume for example that the allowed load resistance $R_L$ is at least $R_L$=5000 Ω. If the resistance is R=50 Ω, about 1% of the output voltage of the operational amplifier OP or the integrated circuit falls at the resistor R. A frequent demand or requirement is that the output voltage has to be able to assume values between 2% and 98% of the operation voltage $V_{VDD} - V_{GND}$. If 1% of the output voltage of the operational amplifier OP falls at the resistor R, the output of the operational amplifier OP has to assume voltages ranging from 1% to 99% of the operation voltage. In order to achieve this, the output transistors NPN and PNP of the operational amplifier OP have to be dimensioned substantially greater than this would be the case for the easy-to-meet demand that the output voltage of the operational amplifier OP is able to assume values between 2% and 98% of the operation voltage.

In addition, the value of the resistor R is subject to process variations as well as temperature dependency. It is typical that at a nominal value of R=50 Ω with a disadvantageous production batch the actual value of the resistor R may well be 75 Ω at room temperature. At an extreme temperature, this value may double and then be at about 150 Ω. In this worst case scenario already 2.9% of the output voltage of the operational amplifier OP fall at the resistor R. At the output OUT of the integrated circuit first only output voltages between 2.9% and 97.1% of the operation voltage are present even if the transistors NPN and PNP would have a saturation voltage of 0 V. With this, the output voltage range does already no longer meet the customer requirement.

A further disadvantage of the described use of the resistor R is that it must not be embodied as diffusion resistor, since in this case it would have a pn-junction to the substrate that may be polarized in flow direction at over or undervoltage at the output OUT. As already mentioned, usually polysilicon is used instead for the formation of the resistor R, which is arranged on field oxide or spatially separated and electrically insulated from the substrate by the field oxide. Such a resistor from polysilicon on field oxide does not have a pn-junction with its environment and in particular the substrate. Therefore, arbitrary potentials or voltages of arbitrary polarity relative to the substrate may be present at the polysilicon resistor. Field oxide, and in particular a thick field oxide layer, however, is a very good thermal insulator, which is why the loss power consumed in the polysilicon resistor can be dissipated substantially harder than this is the case in a structure or a resistor that is directly arranged in a thermally well-conductive substrate. Therefore, the layout of such a silicon resistor insulated from the substrate by a field oxide has to be chosen in an extremely large-area manner, in order to be able to dissipate the loss power as well as possible via a great area. If the polysilicon resistor is embodied in a too small or too small-area manner, it is destroyed by the loss power generated therein.

In expensive silicon technologies two sorts of polysilicon are available, high-ohmic and low-ohmic silicon. In cheap silicon technologies, however, only low-ohmic polysilicon is available. But even if the high-ohmic polysilicon is available, it is not applicable for the realization of a resistor R with a value of about 50 Ω, since the square resistance or the layer resistance of the high-ohmic polysilicon is about 1000 Ω/Square. For a resistance of about 50 Ω, therefore only the low-ohmic polysilicon is suited whose square resistance lies in the order of magnitude of 100 Ω/Square. But low-ohmic polysilicon has the disadvantage that it only has a slightly positive temperature coefficient (typically in the order of magnitude of +100 ppm/° C.) and thus only becomes slightly more high-ohmic with increasing temperature. The protective effect of the resistor R is therefore insufficient especially at the particularly critical high temperatures if it is produced from low-ohmic polysilicon.

The above explanations show that to date no satisfactory solution for the protection of a semiconductor circuit against over or undervoltage present at its output exists.

SUMMARY OF THE INVENTION

It is the object of the present invention to provide an improved semiconductor circuit with an output, which is insensitive to polarizing the output. In accordance with a first aspect, the present invention provides a semiconductor circuit in a semiconductor substrate having a first input for feeding a first supply potential; a second input for feeding a second supply potential higher than the first supply potential, a device, an output, a parasitic pn-junction between the device and the semiconductor substrate, which is conductive at a first polarizing potential at the output smaller than the first supply potential or at a second polarizing potential at the output greater than the second supply potential, and a protective circuit connected between the output and the pn-junction and whose electric resistance at the first polarizing potential at the output and at the second polarizing potential at the output, respectively, is higher than at a normal operation potential at the output lying between the first supply potential and the second supply potential.

The present invention is based on the finding to connect a self-conducting device, in particular a self-conducting field effect transistor, that generates a rising drain source resistance by a negative feedback via its gate for a rising-in-magnitude drain source voltage between those pn-junctions of an integrated circuit that become conductive at polarizing of the output OUT. By such wanted non-linearity, the loss power at a polarizing voltage with great magnitude is largely kept small. In other words, the self-conducting device becomes higher-ohmic with stronger polarizing.

The self-conducting device is constructed so that it has itself no parasitic pn-junctions to the substrate that become conductive at polarizing of the output OUT. Preferably, the self-conducting device has a positive temperature coefficient of its resistor $R_{ds-on}$. Preferably, the self-conducting device includes a pJFET in the case of a p-doped substrate and a n-JFET in the case of an n-doped substrate.

An advantage of the present invention is that it optimally protects the integrated circuit when polarizing at the output, since the protective circuit becomes higher-ohmic with increasing polarizing that the protective circuit, however, only acts minimally spuriously in the normal operation, since it is then relatively low-ohmic.

A particular advantage of the present invention when using a pJFET or an nJFET is the positive temperature coefficient of the drain source resistance. It is +1000 ppm/° C. or more, preferably +3000 ppm/° C. to +5000 ppm/° C., and most preferably +4000 ppm/° C. With rising temperature of the JFET, its channel resistance increases. Thereby, in the polarizing case it comes to a negative feedback, so that the loss power restricting effect of the protective circuit with the JFET is thermally stable.

A further advantage of the present invention is that it is compatible with conventional semiconductor technologies.

A further advantage is that the present invention is usable both with semiconductor circuits with a linear output or a linear output stage and with semiconductor circuits with a digital output.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
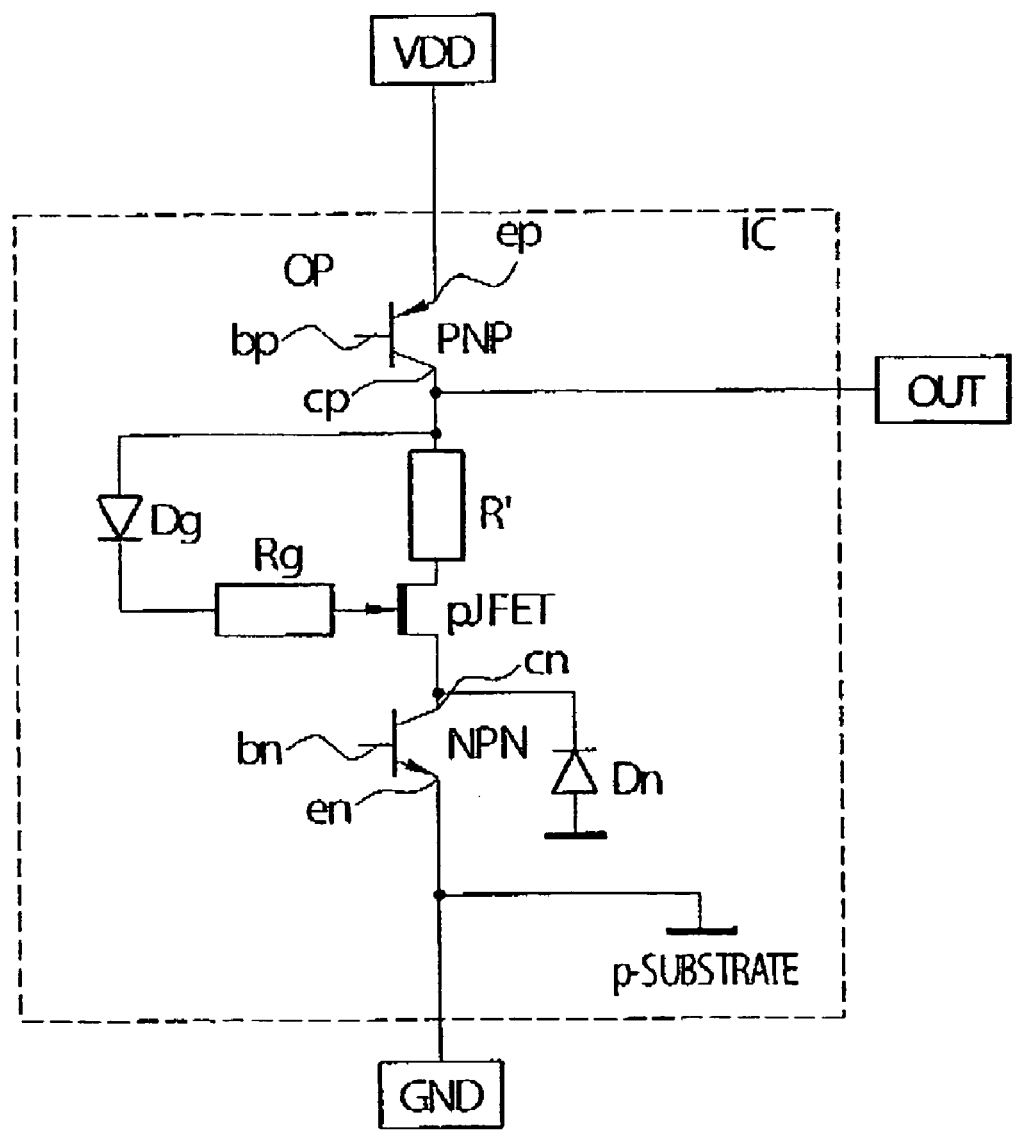
FIG. 1 shows a schematic circuit diagram of a semiconductor circuit according to a first preferred embodiment of the present invention.
Figure 7:
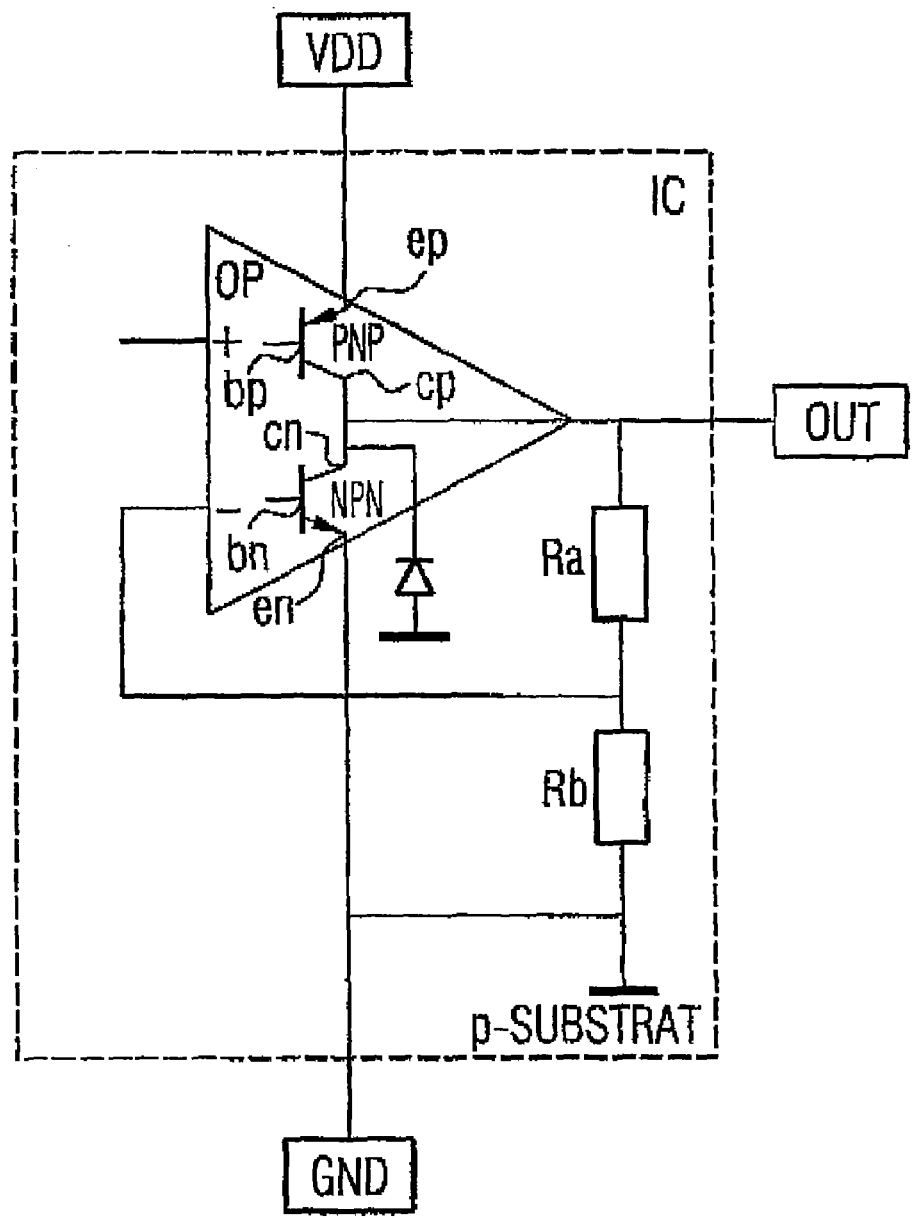
FIG. 7 shows a schematic circuit diagram of a conventional semiconductor circuit.
Figure 8:
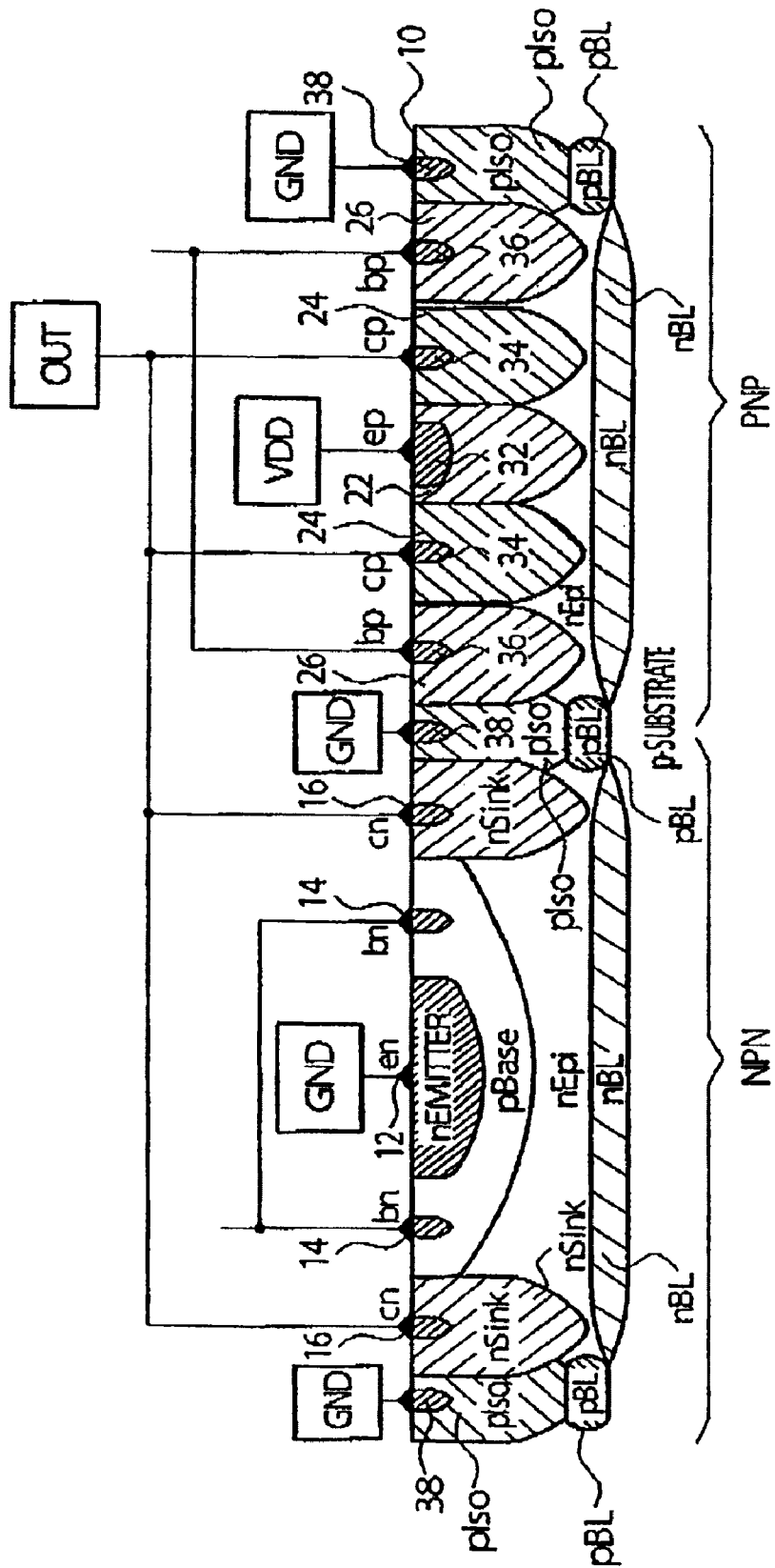
FIG. 8 shows a schematic illustration of a section through a substrate with the semiconductor circuit from FIG. 7.

FIG. 1 is a schematic circuit diagram of a semiconductor circuit according to a first preferred embodiment of the present invention. Similarly to the conventional semiconductor circuits having been illustrated above on the basis of FIGS. 7 to 9, the semiconductor circuit according to the first embodiment of the present invention comprises a small pnp-transistor PNP and a npn-transistor NPN that are connected between a reference potential input GND and a supply potential input VDD. The emitter ep of the pnp-transistor PNP is connected to the supply potential input VDD, the emitter en of the npn-transistor NPN is connected to the reference potential input GND, and the collectors cp, cn of the pnp-transistor PNP and the npn-transistor NPN are connected to each other and to an output OUT of the semiconductor circuit via a subsequently described protective circuit. The emitter en of the npn-transistor NPN and the reference potential input GND are connected to the p-substrate in which the transistors pnp, npn are formed. Between the collector cn of the npn-transistor NPN and the p-substrate, a parasitic diode Dn exists, as it has already been described on the basis of FIGS. 7 to 9. The transistors PNP and NPN are part of an operational amplifier OP whose further devices are omitted for clarity reasons. Similarly, the connection of the bases bp and bn of the transistors PNP, NPN is not illustrated in favor of a clear illustration.

A resistor R' and a channel of a pJFET (pJFET=p-channel junction field effect transistor) are connected between the, collector cp of the pnp-transistor PNP and the output OUT of the semiconductor circuit on the one hand and the collector cn of the npn-transistor NPN on the other. The resistor R' with the collector cp of the pnp-transistor PNP and the channel of the pJFET are connected to the collector cn of the npn-transistor NPN. The collector cp of the pnp-transistor PNP and the output OUT of the semiconductor circuit are further connected to the anode of a diode Dg whose cathode is connected to the gate of the pJFET via a further resistor $R_g$.

Instead of the pJFET, a p-depletion MOSFET or another p-depletion device or a self-conducting device of the p type is usable. Such devices are conductive for the illustrated case in which their gate or their gate terminal are connected to their source or their source terminal and have a channel resistance $R_{ds\_on}$ whose amount mostly lies between 10 Ω and 1000 Ω. For the case discussed here, a channel resistance $R_{ds\_on}$ is assumed.

Figure 9:
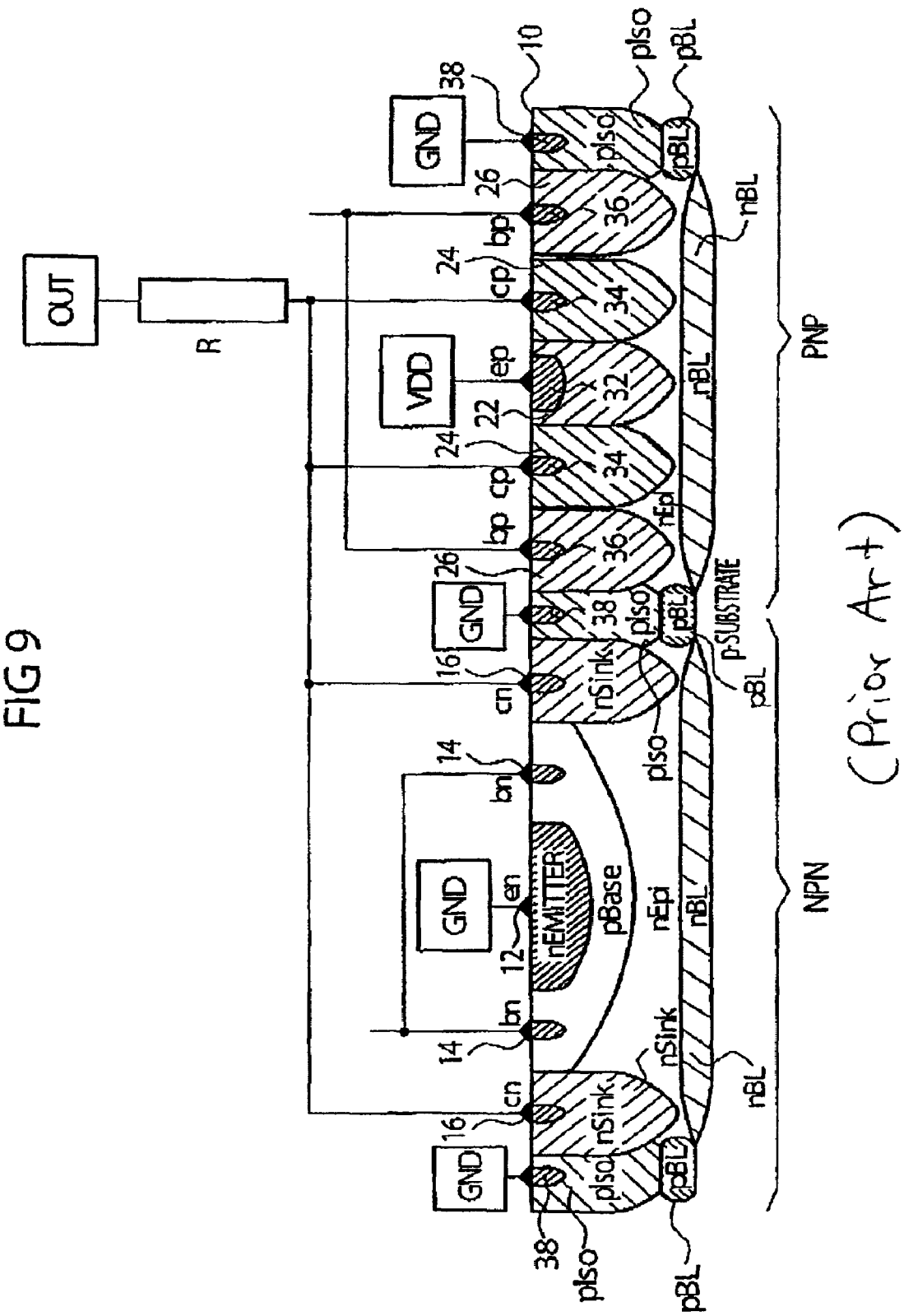
FIG. 9 shows a schematic illustration of a section through a substrate with a further conventional semiconductor circuit.

Since the pnp-transistor PNP—as can be seen from the layer construction in FIG. 9—does not form a parasitic diode to the p-substrate, which forms a conductive connection or a short to the reference potential input GND at a polarizing of the output OUT, it does not have to be protected. Therefore, the pJFET, as illustrated in FIG. 1, is preferably only inserted in the path of the npn-transistor NPN between the output OUT and the reference potential input GND and not also in the path between the collector cp of the pnp-transistor PNP and the output OUT.

In the normal operation or in a normal mode of operation, a higher potential is present at the output OUT than at the reference potential input GND ($V_{OUT} > V_{GND}$). In this case, the pJFET operates like a resistor at which only a relatively small voltage fall (<100 mV) develops, since only relatively low currents (about 1 mA) flow. Between the output OUT and the collector cn of the npn-transistor NPN there is only a relatively small resistance with the magnitude $R' + R_{ds\_on}$ (pJFET) that does not disturb.

If the gate of a p type self-conducting device with a positive voltage relative to the source thereof is controlled or the gate lies on a higher potential than the source, the channel resistance or the resistance $R_{ds}$ of the channel of the p type self-conducting device increases. From a certain voltage Up on, which is designated as pinch-off voltage (potential of the gate higher than the potential of the source), the channel finally becomes extremely high-ohmic or the self-conducting device becomes non-conductive. This is designated as "pinching off" the channel.

In the polarizing case or undervoltage case $V_{OUT} < V_{GND}$, apart from the pass-through voltage or flow voltage at the parasitic diode $D_n$, almost the entire voltage $V_{OUT} - V_{GND}$ between the output OUT and the reference potential input GND falls at the resistor R' and the channel or the drain source distance of the pJFET. A current between 10 mA and 100 mA flows.

Figure 2:
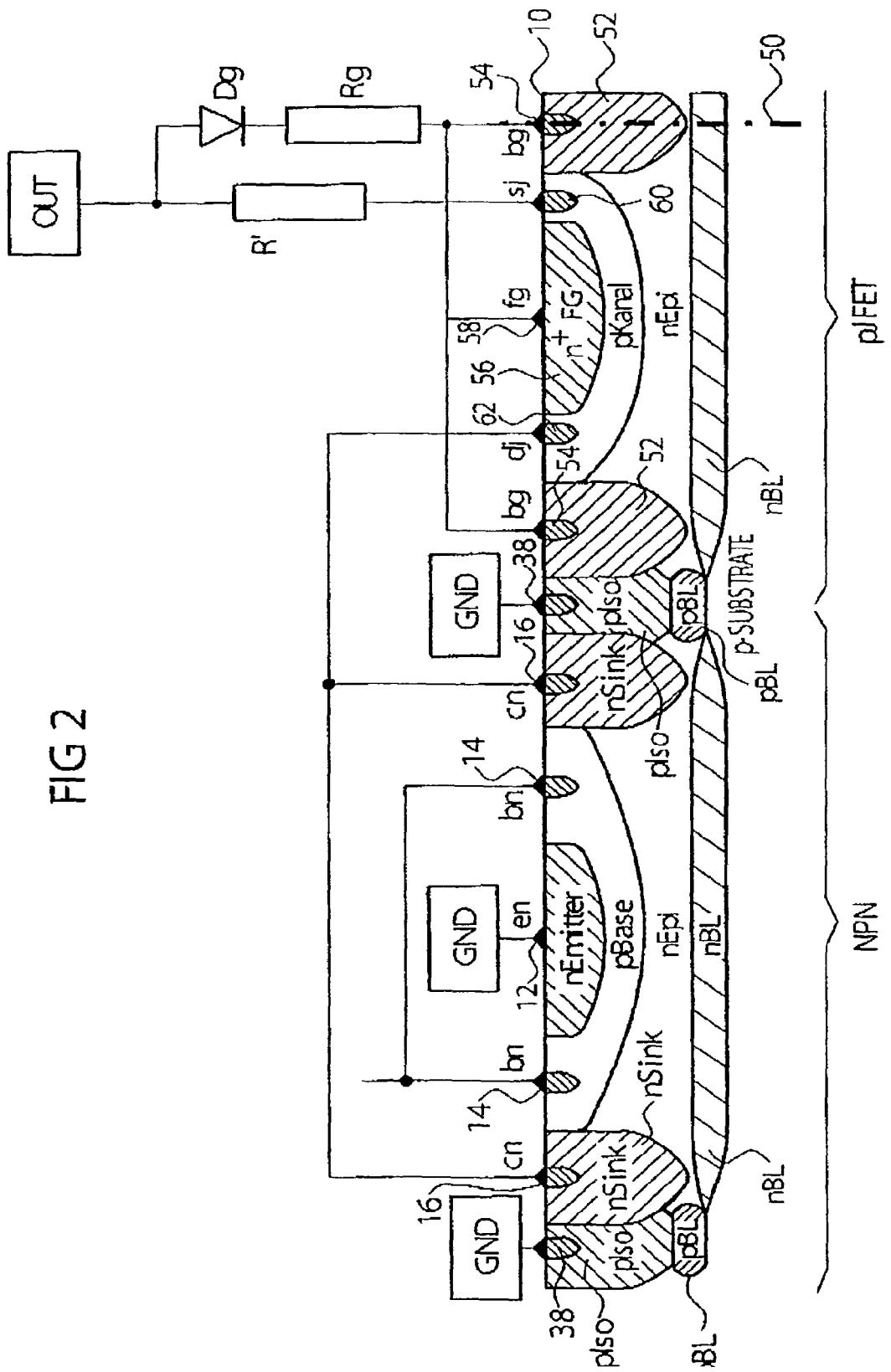
FIG. 2 shows a schematic illustration of a section through a semiconductor substrate with the circuit from FIG. 1.

FIG. 2 is a schematic illustration of a vertical section through a semiconductor substrate with the semiconductor circuit illustrated in FIG. 1. The npn-transistor NPN corresponds to the npn-transistors of the semiconductor circuits illustrated on the basis of FIGS. 7 to 9. Laterally adjacent to these, not the pnp-transistor PNP is illustrated here, but the pJFET. In this embodiment, the pJFET comprises a vertical axis of symmetry 50 illustrated in a dashed-dotted manner to which it is circularly symmetric or axially symmetric. Alternatively, the pJFET laterally comprises an extended oval or octagonal shape. The pJFET is technologically constructed in a similar way as the npn-transistor NPN.

The p-doped channel pKanal is formed by an annulus-shaped p-doped area that has a well shape in the cross-section similar to the p-doped area pBase of the npn-transistor NPN. At its inner edge and its outer edge the p-doped channel pKanal borders on n-doped areas 52 reaching from the surface 10 of the p-substrate to the n-epitaxy layer nepi. The n-epitaxy layer nepi forms the back gate of the pJFET and is contacted via the n-doped areas 52 that are again in ohmic contact to wiring traces via highly n-doped areas 54. Within the p-doped area forming the p-doped channel pKanal, an annular-shaped n$^+$-doped area 56 is arranged forming the front gate n$^+$FG. The front gate n$^+$FG is spatially separated and electrically insulated by inner and outer edge areas of the p-doped channel pKanal from the n-doped areas 52. An ohmic contact of the n$^+$-doped area 56 to a wiring trace is formed via a highly n-doped area 58. The front gate fg and the back gate bg are connected to the further resistor Rg via wiring traces and to the output OUT via this and the diode Dg. The portion of the p-doped channel pKanal reaching over the inner edge of the n$^+$-doped area 56 or bordering on the surface 10 between the n-doped area 52 and the n$^+$-doped area 56 is arbitrarily designated as source sj of the pJFET in the following. The source sj is connected via a highly p-doped area 60 to a wiring trace and via this to the resistor R'. The portion of the p-doped channel pKanal projecting outwardly over the n$^+$-doped area 56 or bordering on the surface 10 between the n$^+$-doped area 56 and the annular-shaped n-doped area 52 is designated as drain dj. The drain dj is connected via an ohmic contact by means of a highly p-doped area 62 to a wiring trace and via this to the collector cn of the npn-transistor NPN. Thus, there are great similarities in the cross-section between the front gate n$^+$FG of the pJFET and the emitter nEmitter of the npn-transistor NPN, between the self-conducting p-doped channel pKanal of the pJFET and the base pBase of the npn-transistor NPN, as well as between the back gate bg of the pJFET and the collector cn of the npn-transistor NPN.

If back gate bg and front gate fg have a positive voltage relative to the drain dj and the source sj, space charge zones develop at the reversely biased pn-junctions and between the n$^+$-doped front gate and the p-doped channel pKanal as well as between the n-doped back gate (nEpi) and the p-doped channel pKanal. With rising reverse voltage, these increasingly reduce the cross-section of the p-channel within which an unhindered current flow from the source sj to the drain dj may turn up, so that the channel pKanal has a rising resistance. If finally, at a pinch-off voltage Up among other things predetermined by the geometry of the pJFET, the two opposing space charge zones starting from the front gate and from the back gate touch, the channel pKanal is pinched off or the pJFET is switched off, i.e. the resistance of the channel is very high, and practically no more current flows.

In the normal operation, $V_{OUT}$ is the highest potential present at the pJFET, namely at the source sj of the pJFET. In this case, the diode Dg and the protective resistor Rg draw the front gate fg and the back gate bg to a potential that corresponds to the potential of the source sj apart from a diode flow voltage of the diode Dg. Thus, the pJFET operates like a resistor of the size $R_{ds\_on} = 50$ Ω.

But if in the polarizing case or in the case of an undervoltage a potential $V_{OUT} < V_{GND}$ is present at the output OUT, a voltage in pass-through direction or flow direction is present at the pn-junction between the p-substrate and the n-doped back gate of the pJFET, and at the same time a voltage in a reverse direction is present at the diode Dg. At the back gate bg and at the front gate fg of the pJFET a potential results that is by about 0.5 V lower than the potential of the p-substrate or the reference potential $V_{GND}$. At the same time, the p-doped source sj of the p-JFET, via the resistor R', lies at the output OUT at which a strongly negative potential relative to the reference potential $V_{GND}$ is present. Therefore, a higher potential than at the source sj of the pJFET lies at the gate terminals bg and fg of the pJFET. Corresponding to the above described performance of the pJFET, this results in an increased channel resistance thereof that does however not completely pinch off. The incomplete pinch-off of the channel is due to the fact that in the described case strictly speaking source and drain are interchanged, since the drain terminal bj lying on the potential $V_{GND}$ now lies on a higher potential than the source terminal sj lying at the potential $V_{OUT}$. Therefore, the gates bg, fg are on a higher potential only relative to the source, but on a lower one relative to the drain. The space charge zones between the non-conductive junction between front gate fg and source on the one hand and the non-conductive junction between back gate bg and source on the other hand do not touch completely, but a conductive channel remains therebetween. The pJFET or its channel thus has a greatly increased resistance, but it is not completely pinched off. In order to render the pJFET completely non-conductive or pinch it off, at least the front gate fg would have to lie on a sufficiently higher potential than both ends of the channel, i.e. than both source and drain.

The pJFET performs just so that it optimally protects the semiconductor circuit at polarizing at the output OUT, since it becomes high-ohmic exactly in this case, while in the normal operation ($V_{OUT}$>$V_{GND}$) it only acts minimally spurious, as it is relatively low-ohmic in this case.

Figure 3:
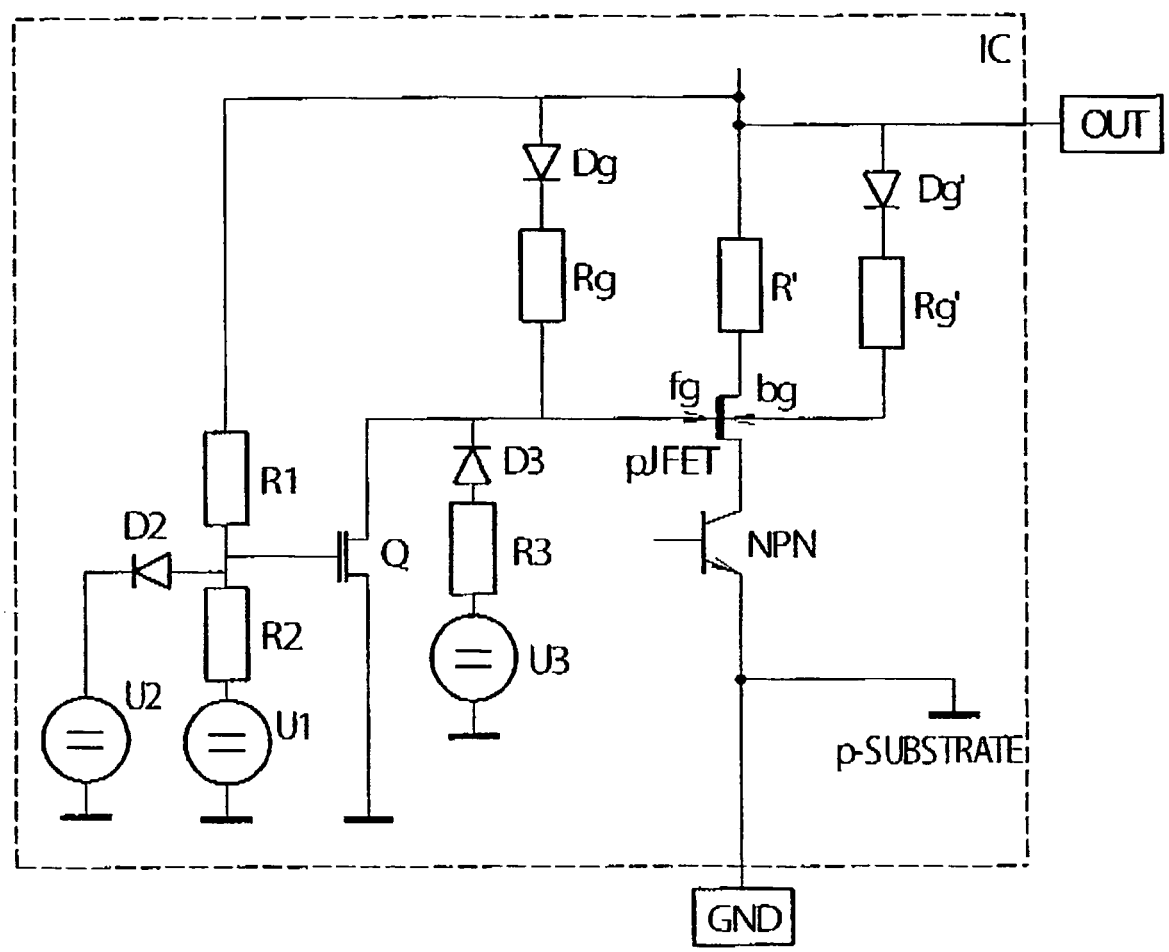
FIG. 3 shows a schematic circuit diagram of a semiconductor circuit according to a second embodiment of the present invention.

FIG. 3 is a schematic circuit diagram of a semiconductor circuit according to a further preferred embodiment of the present invention. This embodiment is a modification of the embodiment illustrated on the basis of FIGS. 1 and 2, in which the front gate fg and back gate bg are no longer connected together in contrast to the first embodiment. As can be seen from the technological cross-section from FIG. 2, only the back gate bg (n-epitaxy layer nEpi and an n-doped buried layer nBL) directly bordered on the p-substrate, but not the front gate fg. If the back gate bg has a potential of at least 0.5 V relative to the p-substrate, because the pn-junction between the p-substrate and the n-doped back gate bg becomes conductive, the front gate fg may at the same time assume an arbitrary, in particular, a higher potential.

In the embodiment illustrated in FIG. 3, therefore a connection between the back gate bg and the front gate fg is not made like in the first embodiment via a wiring trace. Instead, the front gate fg is controlled from a circuit block of its own that is subsequently described in greater detail. It is to ensure that in the normal operational case or in the normal mode of operation ($V_{OUT}$>$V_{GND}$) the front gate fg is connected to the source of the pJFET or has a common potential therewith. Furthermore, the circuit block is to ensure that in the polarizing case or in the undervoltage case ($V_{OUT}$<$V_{GND}$) the front gate fg has a potential that is suited to completely pinch off the channel of the pJFET. To this end, it has to be ensured that the front gate fg has a potential $V_{fg}$>Up, wherein at the same time no breakdown between the front gate fg and back gate bg due to a too high voltage difference therebetween must occur. Since both the pinch-off voltage Up and the pass-through voltage $V_{bg}$ of the back gate bg are subject to only moderate process and temperature variations and are thus well-defined, the latter condition is relatively easy to meet. By controlling the front gate fg with a likewise well-defined voltage, the pJFET may be pinched off in a controlled manner in the undervoltage case, so that the integrated semiconductor circuit consumes almost no loss power in the undervoltage case and is thus optimally protected.

The circuit block or the control circuit for the pJFET and its front gate fg is exemplarily illustrated in FIG. 3 by the resistors R1, R2, R3, the diodes D2, D3, the voltage sources U1, U2, U3, and the NMOS-transistor Q. The NMOS-transistor Q has a conventional enhancement type and is thus self-locking.

In contrast to FIG. 1, in FIG. 3 it is also done without the illustration of the pnp-transistor PNP. In contrast to the embodiments from FIG. 1, not both gates fg, bg of the pJFET are connected to the output OUT via a single protective resistor Rg and a diode Dg, but the front gate fg is connected to the output OUT via a protective resistor Rg and a diode Dg and the back gate bg via a protective resistor Rg' and a diode Dg'. The front gate fg of the pJFET is further connected to the p-substrate via a channel of the NMOS-transistor Q and parallel thereto via a series circuit of the diode D3 of the resistor R3 and the voltage source U3. A series circuit from a voltage splitter from the resistors R1, R2 and the voltage source U1 is further connected between the output OUT or the anodes of the diodes Dg, Dg' on the one hand and the p-substrate. The intermediate tap of the voltage splitter is connected to the gate of the NMOS-transistor Q and to the anode of the diode D2, whose cathode is also connected to the p-substrate via the voltage source U2.

The voltage splitter or the resistors R1, R2 are adjusted so that the NMOS-transistor Q is conductive for output voltages $V_{OUT}$>$V_{GND}$, whereby the drain thereof is drawn in the direction of the potential of the p-substrate or the reference potential $V_{GND}$.

If the NMOS-transistor Q is very strong, and in particular stronger than the protective resistor Rg, it draws the front gate fg to 0 V. Thereby the source of the pJFET is fixed to 0 voltage of 0.6 V, since a diode is present between source and front gate fg. Thus, the effect of the npn-transistor NPN is impeded, and always the same voltage of about 1 V appears at the output OUT. The transistor Q is therefore preferably designed weaker than the resistor Rg or dimensioned so that its effect is weaker than that of the resistor Rg. The potential of the front gate fg then remains slightly below that of the source of the pJFET, and the pJFET conducts.

In the normal operational case, the potential $V_{fg}$ of the front gate fg of the pJFET thus is $V_{fg}$=$V_{GND}$, i.e. the pJFET is not controlled. In the polarizing case or other voltage case $V_{OUT}$<$V_{GND}$, the potential of the gate of the NMOS-transistor Q decreases. The NMOS-transistor Q is then non-conductive, and the front gate fg of the pJFET is applied to a potential that is sufficient to render the pJFET non-conductive by the voltage source U3 via the resistor R3 and the diode D3.

The diode D2 and the voltage source U2 are only provided to prevent the gate of the NMOS-transistor Q in the normal operation from obtaining a too high voltage. Otherwise, this could for example occur if a high positive voltage is applied at the output OUT.

The resistor R3 may for example be identical with the internal resistance of the voltage source U3 which is in this case high-ohmic. This applies particularly when the voltage source U3 is an output of a charge pump.

The task of the protective resistor Rg and the diode Dg is to generate a potential at the front gate fg of the pJFET in the normal operation that is only slightly below the source potential of pJFET. Thereby, a PJET or its channel becomes well conductive and only minimally disturbs or reduces the dynamic range of the illustrated output stage.

The pJFET already possesses an intrinsic pn-junction, because its source is p-doped and borders on its n-doped front gate fg. This intrinsic pn-junction causes the potential of the front gate fg to never be able to sink below the potential of the source sj by more than a diode flow voltage. An advantageous modification of the embodiment illustrated in FIG. 3 is thus to omit the protective resistor Rg and the diode Dg, because their task is looked after by the intrinsic pn-junction of the pJFET. The same consideration also applies and a corresponding modification is also possible for the back gate bg or the protective resistor Rg' and the diode Dg'.

An advantage of the use of a pJFET, as it is shown in the embodiments illustrated on the basis of FIGS. 1 to 3, is a positive temperature coefficient of the drain source resistance of a pJFET. With rising temperature of the pJFET, the drain source resistance or channel resistance also rises. In a polarizing or in the undervoltage case $V_{OUT} < V_{GND}$ therefore a negative feedback occurs, so that the loss power restrictive effect of the pJFET is thermally stable. If a potential negative relative to the reference potential input GND is applied at the output OUT, at first a possibly strong current flows across pJFET. Thereby at first the pJFET heats locally, and consequently the entire semiconductor circuit or the entire chip. Thereby, the electric resistance of the pJFET or its channel resistance rises, whereby the current flow is reduced. The described characteristic in particular leads to the fact that the presented protective circuit restricts the loss power in the semiconductor circuit more strongly in a high temperature than in a low temperature. Thereby, the circuit may cope with the polarizing case in an increased ambient temperature as well without being permanently damaged.

As already mentioned at the beginning, in the case of an n-doped substrate a danger for a semiconductor circuit does not lie in an undervoltage $V_{OUT} < V_{GND}$ but an overvoltage $V_{OUT} > V_{VDD}$, because in this case the parasitic diodes between the n-substrate and the devices are conversely arranged and the n-substrate is connected to the supply potential $V_{VDD}$.

The illustrated embodiments may be easily modified for the case of an n-substrate, wherein a corresponding protective circuit is to be connected between the pnp-transistor PNP or its cathode cp on the one hand and the output OUT.

Although the embodiments illustrated on the basis of FIGS. 1 to 3 show linear output stages and in particular a negatively fed-back operational amplifier OP, the present invention may also be used for semiconductor circuits or device groups, in particular integrated circuits with one or more digital outputs. The output stages of digital circuits mostly also have an npn-transistor NPN or an NMOS-transistor, which draws the potential at the output OUT to the reference potential $V_{GND}$ of the reference potential input GND in a first switching state of the device group. In a second state the npn- or NMOS-transistor is switched off, and a pull-up load resistor draws the potential at the output OUT to a positive potential. The present invention may be used for all semiconductor circuits having a pn-junction connected to an output terminal and that would be biased in flow direction at a polarizing of the output. This constellation is for example always given when the output of the semiconductor circuit is connected to a collector of an npn-transistor NPN or source or drain of an NMOS-transistor.

Alternatively to the pJFET illustrated in FIGS. 1 to 3, as has already been mentioned, the depletion MOSFET or another self-conducting device may be used, wherein the channel of the device advantageously has the same conductivity type as the substrate.

Figure 4:
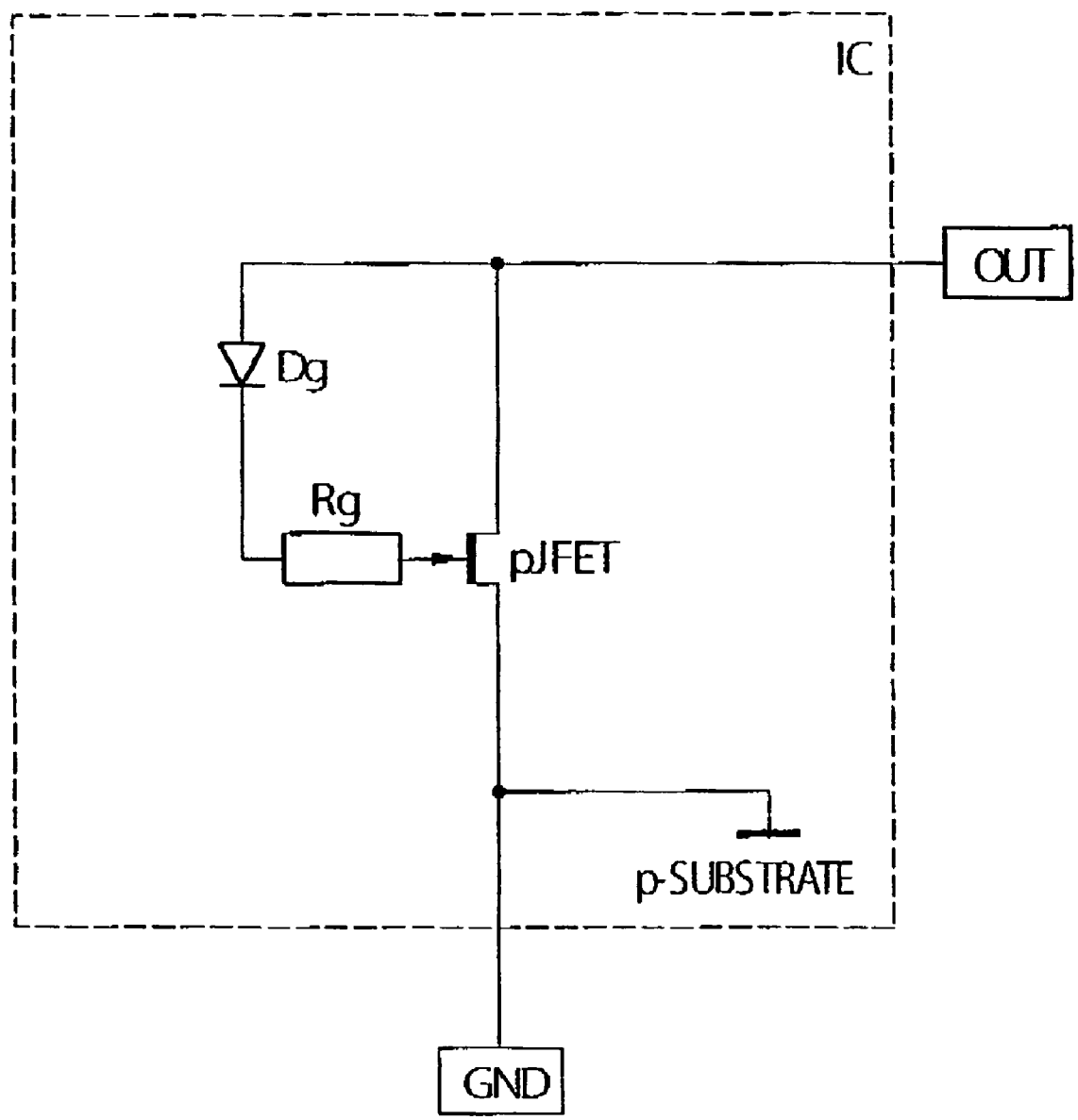
FIG. 4 shows a schematic circuit diagram of a semiconductor circuit according to a third embodiment of the present invention.

FIG. 4 is a schematic circuit diagram of a circuit according to a simplified embodiment of the present invention, on which the functioning of the present invention has been experimentally examined. Here, a pJFET was used that has a drain source resistance of $R_{ds}$=30 Ω as well as a pinch-off voltage Up=2.2 V at a voltage $S_{GS}$ between gate and source of $V_{GS}$=0 V and a voltage $V_{ds}$ between drain and source of $V_{ds}$=0.1 V. The pJFET was constructed with the technological layer sequence illustrated in FIG. 2 on a p-doped substrate and assembled in a housing "C-DIP-24-1". Source and drain of the pJFET are connected to the output OUT at the reference potential input GND, respectively, the output OUT is further connected to the gates of the pJFET via a diode Dg. The resistor Rg has a value of 50 kΩ, the diode Dg is similar to the diode 1 N 4001. Three test chips IC1, IC2, IC3 were produced and mounted in housing C-DIP-24-1. Then a variable voltage VOUT that passed through a cycle from 0 V to −20 V and back to 0 V within a cycle duration of 1.4 minutes was applied at the output OUT. At the same time the current $I_{OUT}$ at the output OUT was measured.

Figure 5:
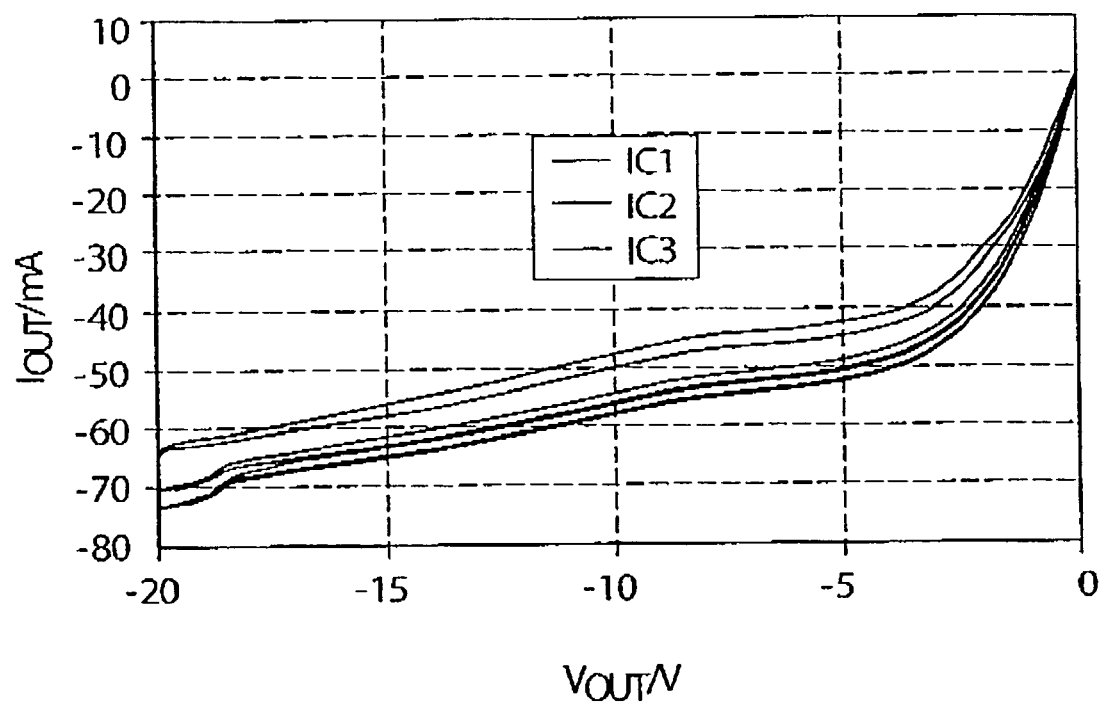
FIG. 5 shows a schematic diagram showing results from measurements on the semiconductor circuit from FIG. 4.
Figure 6:
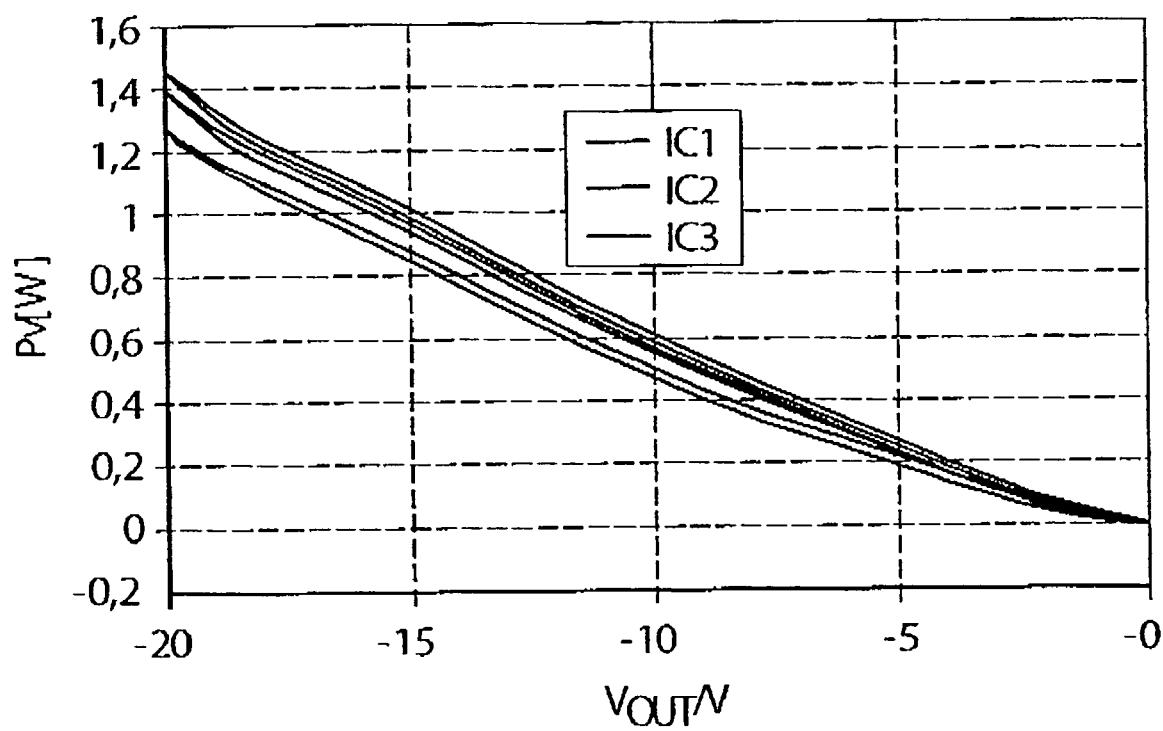
FIG. 6 shows a schematic diagram showing results from measurements on the semiconductor circuit from FIG. 4.

In FIG. 5 the connection between the potential $V_{OUT}$ at the output OUT (measured with reference to the potential $V_{GND}$ at the reference potential input GND) and the current $I_{OUT}$ at the output OUT is schematically illustrated, and in FIG. 6 the dependence of the dissipated power $P_v$ on the potential $V_{OUT}$ is illustrated. The measurements were performed at an ambient temperature of 25° C.

In FIGS. 5 and 6 it is clearly recognizable that the current $I_{OUT}$ and the power $P_v$ have a hysteresis the cause of which lies in the self-heating of the test chips. During the measurement, the test chip heats, so that the temperature of the test chip during the first ramp 0 V . . . −20 V is lower than during the second ramp −20 V . . . 0 V. Due to the positive temperature coefficient of the channel resistance of the pJFET, both the current $I_{OUT}$ and the power $P_v$ each are greater in magnitude during the first ramp than during the second ramp.

I claim:

1. A semiconductor circuit in a semiconductor substrate, comprising:
   a first input for feeding a first supply potential;
   a second input for feeding a second supply potential higher than the first supply potential;
   a device;
   an output;
   a parasitic pn-junction between the device and the semiconductor substrate, which is conductive when the output is at a first polarizing potential smaller than the first supply potential or when the output is at a second polarizing potential greater than the second supply potential; and
   a protective circuit connected between the output and the pn-junction, and whose electric resistance at the first polarizing potential at the output and at the second polarizing potential at the output, respectively, is higher than at a normal operation potential at the output lying between the first supply potential and the second supply potential;
   wherein the semiconductor substrate is a p-doped semiconductor substrate and the protective circuit includes a pJFET, or wherein the semiconductor substrate is an n-doped semiconductor substrate and the protective circuit includes an nJFET.

2. The semiconductor circuit of claim 1, wherein the semiconductor substrate is a p-doped semiconductor substrate and the pn-junction is conductive when the output is at the first polarizing potential smaller than the first supply potential, or wherein the semiconductor substrate is an n-doped semiconductor substrate and the parasitic pn-junction is conductive when the output is at the second polarizing potential greater than the second supply potential.

3. The semiconductor circuit of claim 1, wherein the electric resistance of the protective circuit has a positive temperature coefficient.

4. The semiconductor circuit of claim 1, wherein the parasitic pn-junction is a pn-junction between the semiconductor substrate and a part of the device, which is nonconductive when the output is at a potential greater than the first supply potential and smaller than the second supply potential.

5. The semiconductor circuit of claim 1, which is a linear or digital output stage connected to the output.

6. A semiconductor circuit in a semiconductor substrate, comprising:
a first input for feeding a first supply potential;
a second input for feeding a second supply potential higher than the first supply potential;
an output stage coupled between the first and second input comprising an output and a parasitic pn-junction between the output stage and the semiconductor substrate, which is conductive when the output is at a first polarizing potential smaller than the first supply potential or when the output is at a second polarizing potential greater than the second supply potential; and
a protective circuit connected between the output and the pn-junction, and whose electric resistance at the first polarizing potential at the output and at the second polarizing potential at the output, respectively, is higher than at a normal operation potential at the output lying between the first supply potential and the second supply potential;
wherein the semiconductor substrate is a p-doped semiconductor substrate and the protective circuit includes a pJFET, or wherein the semiconductor substrate is an n-doped semiconductor substrate and the protective circuit includes an nJFET.

7. The semiconductor circuit of claim 6, wherein the semiconductor substrate is a p-doped semiconductor substrate and the pn-junction is conductive when the output is at the first polarizing potential smaller than the first supply potential, or wherein the semiconductor substrate is an n-doped semiconductor substrate and the parasitic pn-junction is conductive when the output is at the second polarizing potential greater than the second supply potential.

8. The semiconductor circuit of claim 6, wherein the electric resistance of the protective circuit has a positive temperature coefficient.

9. The semiconductor circuit of claim 6, wherein the parasitic pn-junction is a pn-junction between the semiconductor substrate and a part of the device, which is nonconductive when the output is at a potential greater than the first supply potential and smaller than the second supply potential.

10. The semiconductor circuit of claim 6, which is a linear or digital output stage connected to the output.

11. The semiconductor circuit of claim 6, wherein the protective circuit is a field effect transistor whose drain source path is coupled between the output and the parasitic pn junction and whose gate is coupled through a diode with the output.

12. The semiconductor circuit of claim 11, further comprising a resistor between the output and the drain source path and a resistor between the gate and the diode.

13. The semiconductor circuit of claim 6, wherein the protective circuit is a first field effect transistor whose drain source path is coupled between the output and the parasitic pn junction and whose back gate is coupled through a diode with the output and whose front gate is coupled with a control circuit for pinching off the first field effect transistor in presence of the first polarizing voltage.

14. The semiconductor circuit of claim 13, wherein the control circuit comprises a second field effect transistor whose drain source path is coupled between the substrate and the front gate and wherein the second field effect transistor is controlled to be conductive if the voltage at the output id greater than the first supply voltage and a voltage source providing a predefined voltage to the front gate.

15. The semiconductor circuit of claim 13, wherein the semiconductor substrate is a p-doped semiconductor substrate and the first field effect transistor is a pJFET, or wherein the semiconductor substrate is an n-doped semiconductor substrate and the first field effect transistor is an nJFET.

16. The semiconductor circuit of claim 14 wherein second field effect transistor is a MOS transistor.

17. A semiconductor circuit in a semiconductor substrate, comprising:
a first input for feeding a first supply potential;
a second input for feeding a second supply potential higher than the first supply potential;
a device;
an output;
a parasitic pn-junction between the device and the semiconductor substrate, which is conductive when the output is at a first polarizing potential smaller than the first supply potential or when the output is at a second polarizing potential greater than the second supply potential; and
a protective circuit connected between the output and the pn-junction, and whose electric resistance at the first polarizing potential at the output and at the second polarizing potential at the output, respectively, is higher than at a normal operation potential at the output lying between the first supply potential and the second supply potential;
wherein the electric resistance of the protective circuit has a positive temperature coefficient.

18. A semiconductor circuit in a semiconductor substrate, comprising:
a first input for feeding a first supply potential;
a second input for feeding a second supply potential higher than the first supply potential;
an output stage coupled between the first and second input comprising an output and a parasitic pn-junction between the output stage and the semiconductor substrate, which is conductive when the output is at a first polarizing potential smaller than the first supply potential or when the output is at a second polarizing potential greater than the second supply potential; and
a protective circuit connected between the output and the pn-junction, and whose electric resistance at the first polarizing potential at the output and at the second polarizing potential at the output, respectively, is higher than at a normal operation potential at the output lying between the first supply potential and the second supply potential;
and wherein the electric resistance of the protective circuit has a positive temperature coefficient.

19. A semiconductor circuit in a semiconductor substrate, comprising:
a first input for feeding a first supply potential;
a second input for feeding a second supply potential higher than the first supply potential;
an output stage coupled between the first and second input comprising an output and a parasitic pn-junction between the output stage and the semiconductor substrate, which is conductive when the output is at a first polarizing potential smaller than the first supply potential or when the output is at a second polarizing potential greater than the second supply potential; and a protective circuit connected between the output and the pn-junction, and whose electric resistance at the first polarizing potential at the output and at the second polarizing potential at the output, respectively, is higher than at a normal operation potential at the output lying between the first supply potential and the second supply potential;

wherein the protective circuit is a field effect transistor whose drain source path is coupled between the output and the parasitic pn junction and whose gate is coupled through a diode with the output.

20. A semiconductor circuit in a semiconductor substrate, comprising:

a first input for feeding a first supply potential;

a second input for feeding a second supply potential higher than the first supply potential;

an output stage coupled between the first and second input comprising an output and a parasitic pn-junction between the output stage and the semiconductor substrate, which is conductive when the output is at a first polarizing potential smaller than the first supply potential or when the output is at a second polarizing potential greater than the second supply potential; and a protective circuit connected between the output and the pn-junction, and whose electric resistance at the first polarizing potential at the output and at the second polarizing potential at the output, respectively, is higher than at a normal operation potential at the output lying between the first supply potential and the second supply potential;

wherein the protective circuit is a first field effect transistor whose drain source path is coupled between the output and the parasitic pn junction and whose back gate is coupled through a diode with the output and whose front gate is coupled with a control circuit for pinching off the first field effect transistor in presence of the first polarizing voltage.

* * * * *